United States Patent
Usui (10) Patent No.: US 10,585,349 B2
(45) Date of Patent: Mar. 10, 2020

(54) IMPRINT APPARATUS AND METHOD OF MANUFACTURING SEMICONDUCTOR DEVICE

(71) Applicant: Toshiba Memory Corporation, Minato-ku (JP)

(72) Inventor: Satoshi Usui, Nagoya (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/051,529

(22) Filed: Aug. 1, 2018

(65) Prior Publication Data
US 2019/0243235 A1 Aug. 8, 2019

(30) Foreign Application Priority Data
Feb. 5, 2018 (JP) .................................. 2018-018613

(51) Int. Cl.
| | |
|---|---|
| *H01L 21/027* | (2006.01) |
| *G03F 7/00* | (2006.01) |
| *B41M 3/00* | (2006.01) |
| B41J 2/045 | (2006.01) |
| G03F 7/16 | (2006.01) |

(52) U.S. Cl.
CPC .......... *G03F 7/0002* (2013.01); *B41M 3/006* (2013.01); *H01L 21/0271* (2013.01); B41J 2/04501 (2013.01); G03F 7/16 (2013.01)

(58) Field of Classification Search
None
See application file for complete search history.

(56) References Cited

U.S. PATENT DOCUMENTS

| | | | |
|---|---|---|---|
| 2010/0237045 A1 | 9/2010 | Koshiba et al. | |
| 2012/0074605 A1* | 3/2012 | Nakagawa | ............... G03F 7/16 264/40.1 |
| 2013/0224963 A1* | 8/2013 | Hatano | ................. G03F 7/0002 438/758 |
| 2013/0249981 A1 | 9/2013 | Nakagawa et al. | |

FOREIGN PATENT DOCUMENTS

| | | |
|---|---|---|
| JP | 2012-19222 | 1/2012 |
| JP | 2013-062286 | 4/2013 |
| JP | 2013-201278 | 10/2013 |

* cited by examiner

*Primary Examiner* — Bo B Jang
(74) *Attorney, Agent, or Firm* — Oblon, McClelland, Maier & Neustadt, L.L.P.

(57) ABSTRACT

According to one embodiment, an imprint apparatus includes: an ejection unit that ejects droplets of a resin-based mask material on a substrate on the basis of a droplet dropping condition; and a control unit that selects a first droplet dropping condition according to a pattern to be transferred to the resin-based mask material and a second droplet dropping condition according to an underlying step difference amount that is concave-convex of a first shot area and causes the ejection unit to eject the droplets with respect to the first shot area, wherein the shot area where a pattern is formed on the substrate by one time of imprinting is set.

11 Claims, 6 Drawing Sheets

RECIPE A

IMPRINT APPARATUS AND METHOD OF MANUFACTURING SEMICONDUCTOR DEVICE

CROSS-REFERENCE TO RELATED APPLICATIONS

This application is based upon and claims the benefit of priority from Japanese Patent Application No. 2018-018613, filed on Feb. 5, 2018; the entire contents of which are incorporated herein by reference.

FIELD

Embodiments of the present invention relate to an imprint apparatus and a method of manufacturing a semiconductor device.

BACKGROUND

As a method for forming a fine pattern, an imprinting method has been proposed. In the imprinting method, a resist is applied on a film to be processed, a template on which a fine pattern is formed is pressed against the resist so that the concave portion of the template is filled with the resist, and then the resist is cured by irradiating with ultraviolet rays. The resist from which the template has been released becomes a mask for processing the film to be processed.

In the related art, the imprinting process still have a room for improvement in terms of, for example, uniformity of the resist pattern in a plane of a substrate.

DETAILED DESCRIPTION

According to an embodiment, an imprint apparatus includes: an ejection unit that ejects droplets of a resin-based mask material on a substrate on the basis of a droplet dropping condition; and a control unit that selects a first droplet dropping condition according to a pattern to be transferred to the resin-based mask material and a second droplet dropping condition according to an underlying step difference amount that is concave-convex of a first shot area and causes the ejection unit to eject the droplets with respect to the first shot area, wherein the shot area where a pattern is formed on the substrate by one time of imprinting is set.

Hereinafter, the present invention will be described in detail with reference to the drawings. In addition, the present invention is not limited by the following embodiments. In addition, constituent elements in the following embodiment include those that can be easily assumed by those skilled in the art or those that are substantially the same.

Embodiment

The imprint apparatus according to an embodiment will be described with reference to FIGS. 1 to 8.

(Configuration Example of Imprint System)

Figure 1:
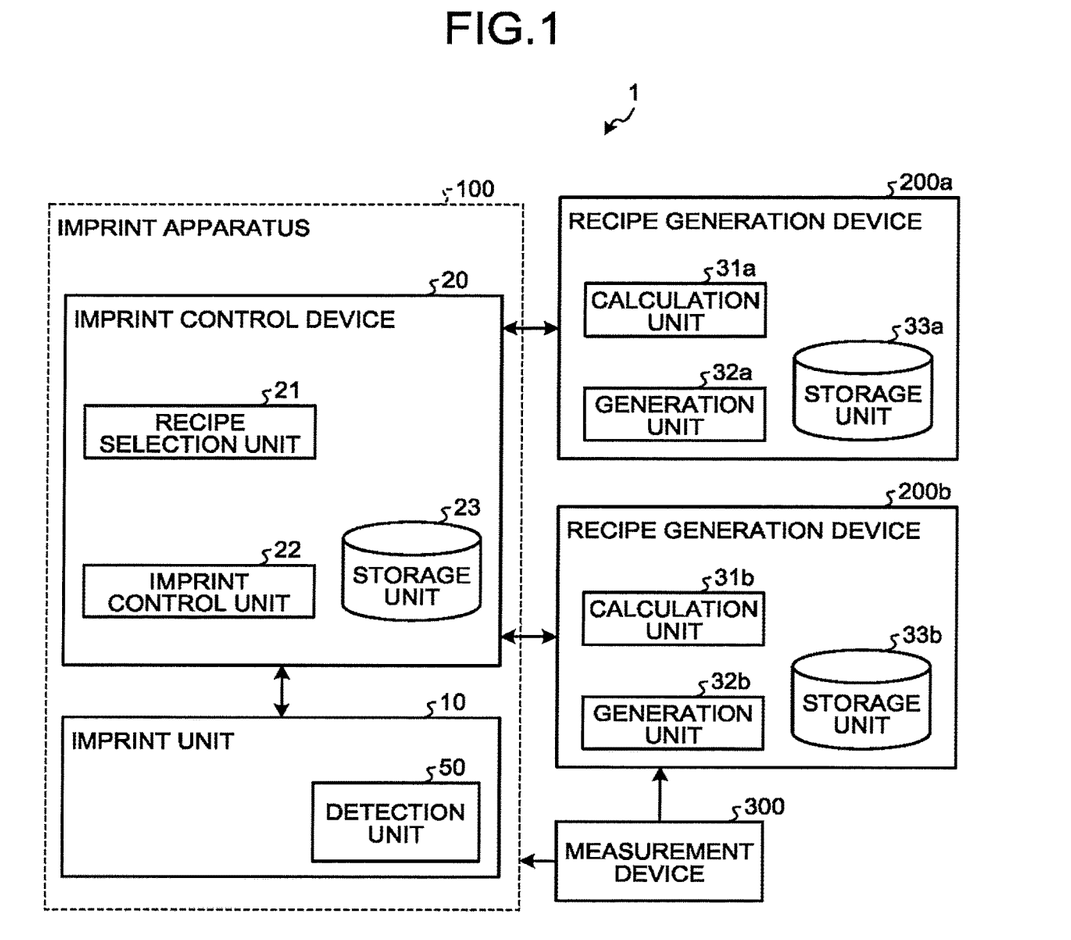
FIG. 1 is a diagram illustrating an overall configuration of an imprint system according to an embodiment.

FIG. 1 is a diagram illustrating an overall configuration of an imprint system 1 according to the embodiment. As illustrated in FIG. 1, the imprint system 1 includes an imprint apparatus 100 and recipe generation devices 200*a* and 200*b* as droplet dropping condition generation devices. The imprint apparatus 100 and the recipe generation devices 200*a* and 200*b* are connected to each other so as to communicate with each other.

The imprint apparatus 100 includes an imprint unit 10 and an imprint control device 20 as a control unit. The imprint unit 10 and the imprint control device 20 are connected to each other so as to communicate with each other.

The imprint unit 10 ejects a resist on a wafer as a substrate and transfers a pattern of a template to the resist. The ejection of the resist is performed in accordance with a drop recipe A as a first droplet dropping condition or a drop recipe B as a second or third droplet dropping condition. The drop recipes A and B define the number, arrangement, size, and the like of droplets of the resist to be ejected. The resist is, for example, a photo-curable resin-based mask material before curing or a photo-curable resin-based mask after curing. Hereinafter, both a liquid resin-based mask material before photocuring and a patterned resin-based mask after photocuring are referred to as a resist.

The imprint unit 10 includes a detection unit 50. The detection unit 50 detects ejection positions of droplets ejected on the wafer.

The imprint control device 20 is configured as, for example, a computer including a hardware processor such as a central processing unit (CPU), a memory, a hard disk drive (HDD), and the like.

The imprint control device 20 causes the droplet dropping device 17 of the imprint unit 10 which will be described later to eject the droplets of resist on a shot area which is an area to be patterned by one time of imprinting, in accordance with the drop recipe A according to the pattern to be transferred to the resist ejected on the wafer. In addition, the imprint control device 20 causes the droplet dropping device 17 to eject the droplets of resist on the shot area from which the droplets have been ejected, in accordance with the drop recipe B according to the underlying step difference amount of the shot area of the wafer. The underlying step difference amount is concave-convex in the shot area including a warp of the wafer and the like. In order to realize such a function, the imprint control device 20 includes a recipe selection unit 21 as a droplet dropping condition selection unit, an imprint control unit 22, and a storage unit 23 functionally conceptually. The recipe selection unit 21, the imprint control unit 22, and the storage unit 23 may be realized by the CPU executing a program, or may be realized by a dedicated hardware circuit. In addition, the storage unit 23 may be realized by an HDD or the like. The recipe selection unit 21 and the imprint control unit 22 are connected so as to communicate with each other. The recipe selection unit 21 and the imprint control unit 22 are also connected to the storage unit 23 so that various pieces of information stored in the storage unit 23 can be referred to.

The recipe selection unit 21 selects the drop recipes A and B to be used by the imprint unit 10 at the time of an imprinting process. As will be described later, a plurality of drop recipes A are generated, for example, every time the pattern to be transferred to the resist is different. Therefore, the selection of the drop recipe A is performed, for example, according to the density or the like of the pattern transferred to the resist. As will be described later, a plurality of drop recipes B are generated every time the underlying step difference amount including the warp of the wafer is different. Therefore, the selection of the drop recipe B is performed, for example, according to the underlying step difference amount at various positions on the wafer.

The imprint control unit 22 controls the imprint unit 10 to cause the imprint unit 10 to perform the imprinting process.

The storage unit 23 stores a plurality of drop recipes A and a plurality of drop recipes B generated by the recipe generation devices 200a and 200b. Each drop recipe A is individually associated with a different pattern. That is, one drop recipe A is associated with one pattern. A different underlying step difference amount is associated with each drop recipe B individually. That is, there are a plurality of drop recipes B according to the underlying step difference amounts at various positions on the wafer.

The recipe generation devices 200a and 200b are configured as, for example, a computer including a hardware processor such as a central processing unit (CPU), a memory, a hard disk drive (HDD), and the like.

The recipe generation device 200a is configured to generate a drop recipe A that is optimized for each pattern transferred to the resist. More specifically, the recipe generation device 200a includes a calculation unit 31a, a generation unit 32a, and a storage unit 33a functionally conceptually. The calculation unit 31a, the generation unit 32a, and the storage unit 33a may be realized by the CPU executing a program, or may be realized by a dedicated hardware circuit. In addition, the storage unit 33a may be realized by an HDD or the like. The calculation unit 31a and the generation unit 32a are connected to each other so as to communicate with each other. The calculation unit 31a and the generation unit 32a are also connected to the storage unit 33a so that various pieces of information stored in the storage unit 33a can be referred to.

The calculation unit 31a creates a plurality of density maps on the basis of information obtained from design data. The density map is a map in which the number and arrangement of droplets are optimized according to the density of the pattern to be transferred and the like, respectively.

The generation unit 32a generates a drop recipe A according to each density map on the basis of the density map created by the calculation unit 31a. That is, one drop recipe A is generated for one density map.

The design data of various patterns, the density map created by the calculation unit 31a, and the drop recipe A generated by the generation unit 32a are stored in the storage unit 33a.

The recipe generation device 200b is configured to generate a drop recipe B that is optimized for each underlying step difference amount of each position on the wafer. Specifically, the recipe generation device 200b includes a calculation unit 31b, a generation unit 32b, and a storage unit 33b functionally conceptually. The calculation unit 31b, the generation unit 32b, and the storage unit 33b may be realized by the CPU executing a program, or may be realized with a dedicated hardware circuit. In addition, the storage unit 33b may be realized by an HDD or the like. The calculation unit 31b and the generation unit 32b are connected to each other so as to communicate with each other. The calculation unit 31b and the generation unit 32b are also connected to the storage unit 33b so that various pieces of information stored in the storage unit 33b can be referred to.

The calculation unit 31b creates a concave-convex map on the basis of the underlying step difference amount at each position on the wafer. In a case where the underlying step difference amount is caused by warp of the wafer, for example, the wafer is partitioned into a portion having a relatively large dent (concave portion) in the wafer plane and a portion having a relatively small dent (convex portion) in the wafer plane. A concave-convex map is created for these concave and convex portions.

The generation unit 32b generates a plurality of drop recipes B1, B2, B3, . . . according to the concave-convex arrangement in the shot in the wafer plane, which will be described later, on the basis of the concave-convex map created by the calculation unit 31b. That is, drop recipes B are generated with respect to a plurality of shot areas having different concave-convex arrangements, respectively. The shot area is an area to be patterned by one time of the imprinting process.

The underlying step difference amounts (concave-convex arrangements) of various shots and the concave-convex map created by the calculation unit 31b, and the drop recipe B generated by the generation unit 32b are stored in the storage unit 33b.

A measurement device 300 is connected to the imprint apparatus 100 and the recipe generation devices 200a and 200b so that measurement information can be transmitted to the apparatus 100 and the devices 200a and 200b. The measurement device 300 is a device such as an atomic force microscope (AFM) that can measure the underlying step difference amount at various positions of a wafer.

(Configuration Example of Imprint Apparatus)

Next, the configuration of the imprint apparatus 100 will be further described.

Figure 2:
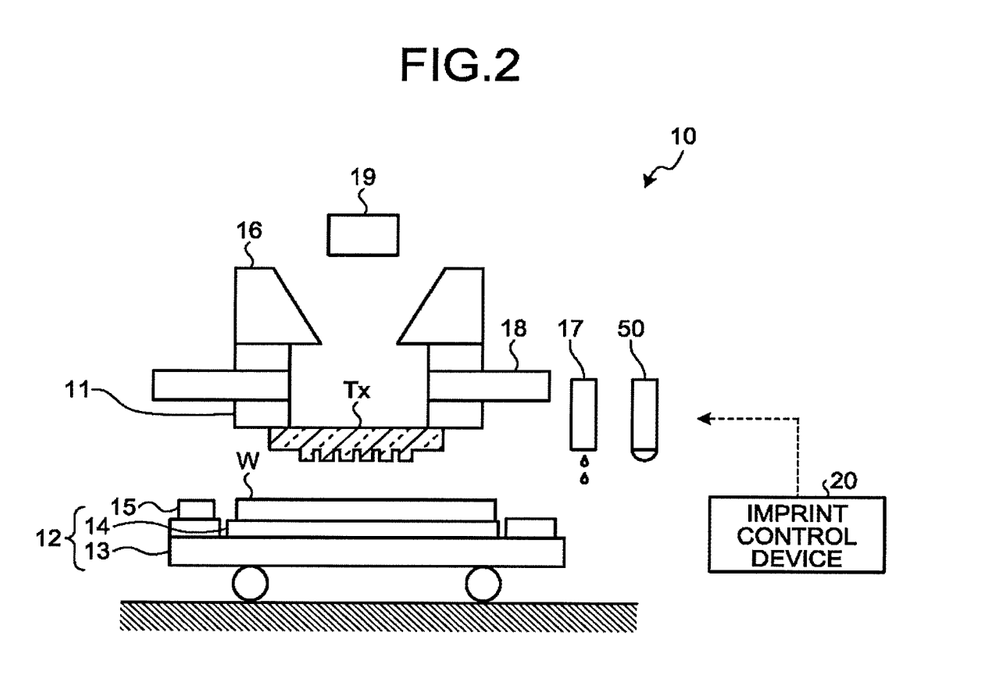
FIG. 2 is a diagram illustrating a configuration of an imprint unit according to the embodiment.

First, the configuration of the imprint unit 10 will be described with reference to FIG. 2. FIG. 2 is a diagram illustrating the configuration of the imprint unit 10 according to the embodiment. As illustrated in FIG. 2, the imprint unit 10 includes a template stage 11, a mounting table 12, a reference mark 15, an alignment unit 16, a droplet dropping device 17 as an ejection unit, a stage base 18, a light source 19, and a detection unit 50.

The mounting table 12 includes a wafer chuck 14 and a main body 13. The wafer chuck 14 fixes the wafer W at a predetermined position on the main body 13. A reference mark 15 is provided on the mounting table 12. The reference mark 15 is used for positioning at the time of loading the wafer W on the mounting table 12.

The mounting table 12 is mounted with the wafer W and moves in a plane parallel (in a horizontal plane) to the mounted wafer W by a motor (not illustrated). When the resist is to be dropped on the wafer W, the mounting table 12 moves the wafer W to the lower side of the droplet dropping device 17, and when transferring to the wafer W is to be performed, the mounting table 12 moves the wafer W to the lower side of the template Tx.

The template Tx is an original used for nanoimprint lithography, for example. A template pattern is three-dimensionally formed on the lower surface side of the template Tx.

The stage base 18 supports the template Tx by the template stage 11 and pushes the template pattern of the template Tx against the resist on the wafer W by moving in the upward/downward direction (vertical direction).

The alignment unit 16 is provided on the stage base 18. The alignment unit 16 includes, for example, a microscope and the like (not illustrated) and detects the position of the wafer W and the position of the template Tx.

The droplet dropping device 17 is a device that drops a photo-curable resist on the wafer W by an inkjet method. An inkjet head provided to the droplet dropping device 17 has a plurality of fine holes ejecting droplets of resist and drops dotted resist (droplets) on the wafer W. The dropping conditions such as the number, arrangement, and size of the droplets are in accordance with the drop recipes A and B.

The light source 19 is, for example, a device that performs irradiation with ultraviolet rays and is provided above the stage base 18. The light source 19 performs irradiation with light from the above of the template Tx in the state where the template Tx is pressed against the resist.

The detection unit 50 includes a CCD, a CMOS sensor, or the like. The detection unit 50 detects the ejection positions of the droplets of the resist ejected on the wafer W. Note that the alignment unit 16 may function as a detection unit.

The imprint control device 20 controls the template stage 11, the mounting table 12, the reference mark 15, the alignment unit 16, the droplet dropping device 17, the stage base 18, the light source 19, and the detection unit 50.

Figure 3:
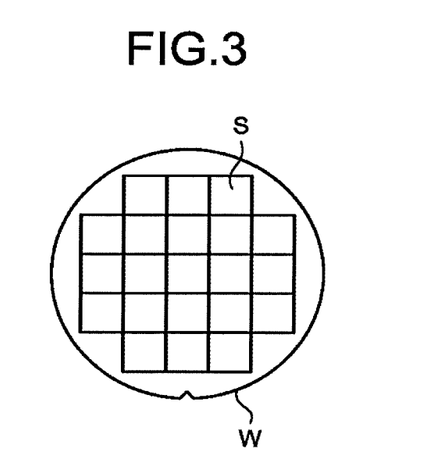
FIG. 3 is a schematic diagram illustrating a shot area arranged on a wafer.

Meanwhile, a plurality of shots are arranged on the wafer W after the imprinting process. FIG. 3 is a schematic diagram illustrating the shot area S arranged on the wafer W. One shot area S is an area which is to be patterned by one time of imprinting (pressing of the template Tx). The template Tx is pressed against the resist of the shot area S, and the resist is patterned, so that a shot is formed on the wafer W. That is, the shot area S can also be referred to as a shot formation planned area. In addition, several thousands to tens of thousands of droplets of resist are dropped into the shot area S for each time of imprinting.

The imprint control device 20 ejects droplets of the resist to the shot area S in accordance with the drop recipes A and B.

The drop recipe A is selected according to the pattern transferred to the resist. This information is acquired by the imprint control device 20 in advance, for example, at the time of starting a lot process. The recipe selection unit 21 of the imprint control device 20 refers to the storage unit 23 to obtain information of a pattern to be transferred to the resist. The recipe selection unit 21 selects the drop recipe A according to the obtained pattern information.

The drop recipe B is selected according to the underlying step difference amount included in each shot area S. The underlying step difference amount is measured in advance for each shot area S of each wafer W as an imprinting process target. The recipe selection unit 21 refers to the storage unit 23 to obtain information on the underlying step difference amount of the shot area S to be imprinted. The recipe selection unit 21 selects the drop recipe B according to the obtained information on the underlying step difference amount.

The imprint control unit 22 of the imprint control device 20 moves the mounting table 12 so that the predetermined shot area S is positioned below the droplet dropping device 17. Then, the imprint control unit 22 causes the droplet dropping device 17 to eject the droplets of the resist to a predetermined shot area S on the wafer W in accordance with the selected drop recipe A.

The imprint control unit 22 also controls the detection unit 50 to detect the ejection positions of the droplets ejected to the shot area S. Although the droplet dropping device 17 ejects the droplets in accordance with the selected drop recipe A, in some cases, the actual positions of the droplets on the wafer W may be different from the target positions. This is due to the accuracy of movement control of the mounting table 12.

In a case where the detected ejection positions of the droplets are deviated from the target positions, the imprint control unit 22 moves the mounting table 12 to correct the deviation.

The imprint control unit 22 causes the droplet dropping device 17 to eject the droplets of the resist to the same shot area S on the wafer W in accordance with the selected drop recipe B at the corrected position of the mounting table 12.

As described above, in the imprinting process in the imprint unit 10 with respect to the shot area S to which the droplets of the resist have been ejected, the template Tx is pressed against the resist so that the concave portion of the template Tx is filled with the resist, and then, the resist is cured by irradiation with ultraviolet rays. After that, the template Tx is released.

(Function of Recipe Generation Device)

Next, the functions of the recipe generation devices 200a and 200b will be described in more detail with reference to FIGS. 4 and 5.

Figure 4:
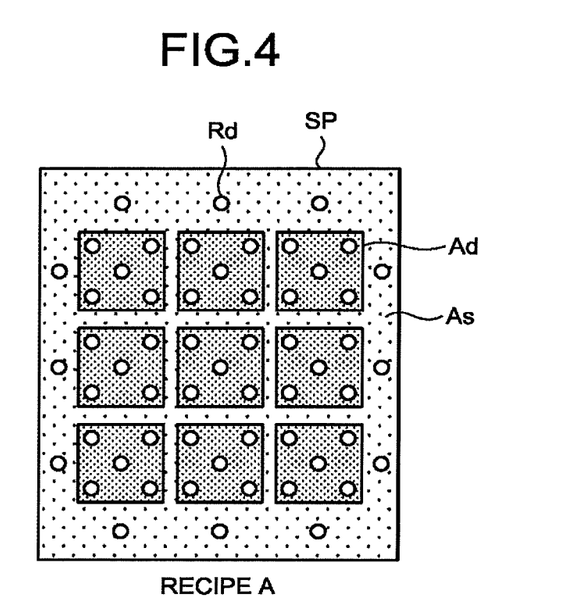
FIG. 4 illustrates an example of a drop recipe A generated by a recipe generation device according to the embodiment.

FIG. 4 illustrates an example of the drop recipe A generated by the recipe generation device 200a according to the embodiment. As illustrated in FIG. 4, the recipe generation device 200a generates an appropriate drop recipe A for a certain shot pattern SP. The shot pattern SP of FIG. 4 has nine dense areas Ad near the center of the shot area S and a sparse area As near the outer periphery of the shot area S. The recipe generation device 200a arranges a large number of droplets Rd at a high density in the dense area Ad. The recipe generation device 200a arranges a small number of droplets Rd at a low density in the sparse area As. In this manner, the recipe generation device 200a generates one drop recipe A for one shot pattern SP.

Figure 5:
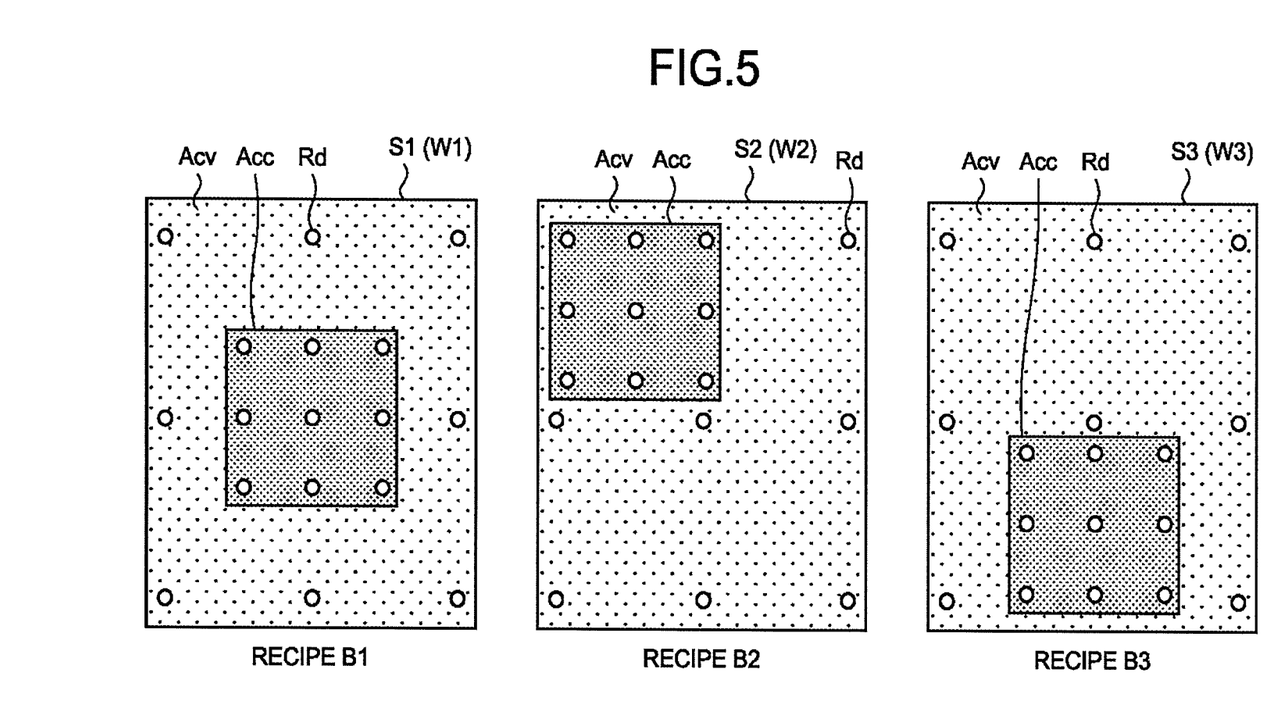
FIG. 5 illustrates an example of a drop recipe B generated by a recipe generation device according to the embodiment.

FIG. 5 illustrates an example of drop recipes B1, B2, and B3 generated by the recipe generation device 200b according to the embodiment. As illustrated in FIG. 5, the recipe generation device 200b generates an appropriate drop recipe B for the arrangement of the underlying step differences (concave-convex arrangement) in a certain shot area S. For example, a certain shot area S1 has a concave-convex arrangement W1. In the concave-convex arrangement W1, the central portion of the shot area S1 becomes relatively a concave portion Acc. That is, the concave-convex arrangement W1 has a dent larger in the central portion of the shot area S1. In addition, in the concave-convex arrangement W1, the outer peripheral portion of the shot area S1 becomes relatively a convex portion Acv. That is, the concave-convex arrangement W1 has a dent smaller in the outer peripheral portion of the shot area S1. The recipe generation device 200b arranges a large number of droplets Rd at a high density in the concave portion Acc. The recipe generation device 200b arranges a small number of droplets Rd at a low density in the convex portion Acv. In this manner, the drop recipe B1 is generated.

In addition, a certain shot area S2 has a concave-convex arrangement W2 in which the upper left side of the paper surface is a concave portion Acc. By arranging the droplets Rd in the concave portion Acc and the convex portion Acv of the concave-convex arrangement W2 in the same manner as described above, the drop recipe B2 is generated.

In addition, a certain shot area S3 has a concave-convex arrangement W3 in which the lower central side of the paper surface is a concave portion Acc. By arranging the droplets Rd in the concave portion Acc and the convex portion Acv of the concave-convex arrangement W3 in the same manner as described above, the drop recipe B3 is generated.

In this manner, the recipe generation device 200b generates the drop recipes B1 to B3 for the shot areas S1 to S3 having, for example, different concave-convex arrangements W1 to W3, respectively.

(Example of Processing of Imprint Apparatus)

Figure 6:
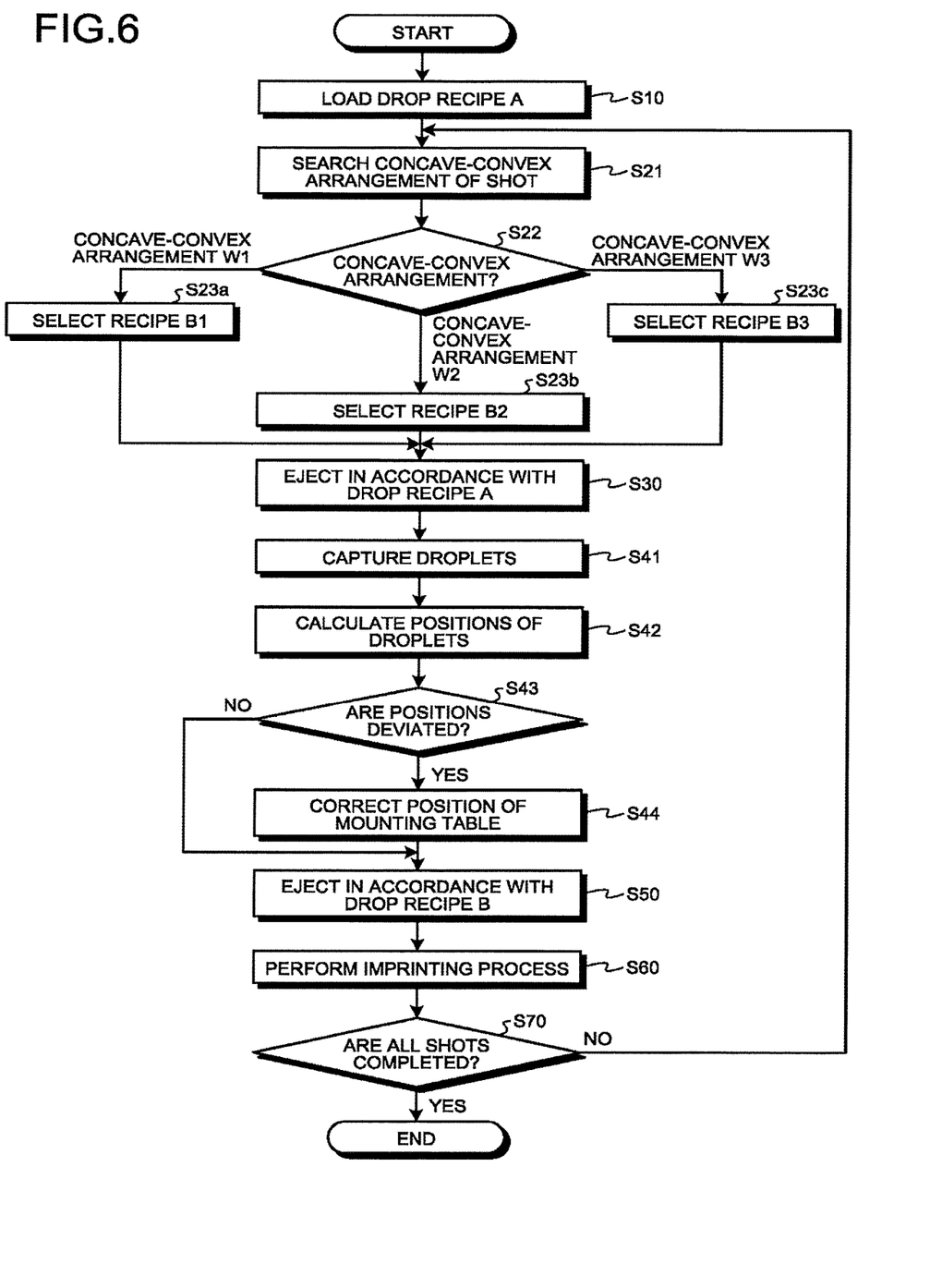
FIG. 6 is a flowchart illustrating an example of a procedure of an imprinting process in the imprint apparatus according to the embodiment.

Next, an example of an imprinting process in the imprint apparatus 100 as one process of a semiconductor device manufacturing process will be described with reference to FIG. 6. FIG. 6 is a flowchart illustrating an example of a procedure of the imprinting process in the imprint apparatus 100 according to the embodiment.

In the example of FIG. 6, it is assumed that, before the start of the imprinting process, the information of the pattern to be transferred is transmitted from the outside of the imprint apparatus 100 and stored in the storage unit 23. In addition, it is assumed that, before the start of the imprinting process, measurement of the underlying step differences of the wafer W associated with the imprinting process is performed by the measurement device 300. For each shot area S on the wafer W, the information on the concave-convex arrangement of the underlying step differences is transmitted from the measurement device 300 to the imprint apparatus 100 and stored in the storage unit 23. It is assumed that each shot area S of the wafer W associated with the imprinting process has any concave-convex arrangement among the concave-convex arrangements W1 to W3 described above.

As illustrated in FIG. 6, in Step S10, the recipe selection unit 21 refers to the storage unit 23 and selects and loads the drop recipe A on the basis of the pattern to be transferred. Since the pattern transferred to all the shots on the wafer W is generally only one type pattern, the drop recipe A loaded at this time is applied to all the shots of the wafer W.

In Step S21, the recipe selection unit 21 refers to the storage unit 23 and searches which one of the concave-convex arrangements W1 to W3 the shot area S associated with the next imprinting process has. In Step S22, when the concave-convex arrangement is the concave-convex arrangement W1, in Step S23a, the recipe selection unit 21 selects the drop recipe B1. When the concave-convex arrangement is the concave-convex arrangement W2, in Step S23b, the recipe selection unit 21 selects the drop recipe B2. When the concave-convex arrangement is the concave-convex arrangement W3, in Step S23c, the recipe selection unit 21 selects the drop recipe B3.

In Step S30, the imprint control unit 22 controls each component of the imprint unit 10 to eject droplets of resist to the shot area S as an imprinting process target on the basis of the drop recipe A.

In Step S41, the imprint control unit 22 causes the detection unit 50 to capture an image of the ejected droplets. In Step S42, the imprint control unit 22 calculates the positions of the captured droplets. In Step S43, the imprint control unit 22 determines whether or not the actual ejection positions are deviated from the target positions on the basis of the calculated positions of the droplets. When there is no deviation (No), the process proceeds to Step S50. When there is a deviation (Yes), the imprint control unit 22 corrects the position of the mounting table 12 in Step S44.

In Step S50, the imprint control unit 22 controls each component of the imprint unit 10 and ejects droplets of resist to the shot area S, to which droplets have been ejected in accordance with the drop recipe A, on the basis of the selected drop recipe B.

In Step S60, the imprint control unit 22 performs an imprinting process following the droplets ejection.

In Step S70, the imprint control unit 22 determines whether or not the imprinting process of all shot areas S has been ended. When the imprinting process has not been ended (No), the process returns to Step S21, and the same flow is repeated for the next shot area S. As described above, the imprinting process is performed for each shot area S while appropriately selecting the drop recipe B. When the process of all the shot areas S has been ended (Yes), the imprinting process on the wafer W is ended.

Thus, the imprinting process in the imprint apparatus 100 is completed.

Figure 7:
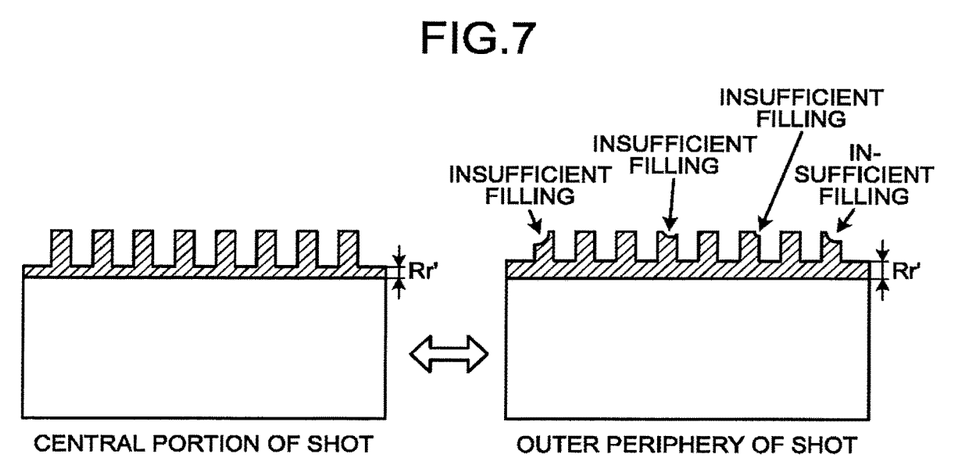
FIG. 7 is a cross-sectional view of a wafer performed an imprinting process by an imprint apparatus according to Comparative Example.
Figure 8:
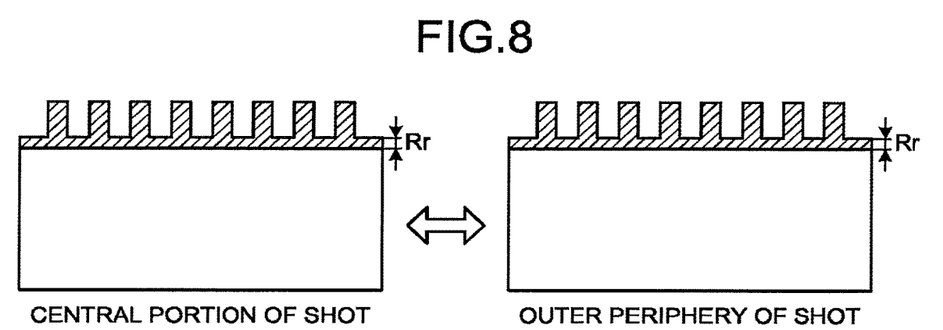
FIG. 8 is a cross-sectional view of a wafer performed an imprinting process by the imprint apparatus according to the embodiment.

Herein, in order to describe the effect of the imprint apparatus 100 according to the embodiment, the imprint apparatus according to Comparative Example and the imprint apparatus 100 according to the embodiment are compared with each other with reference to FIGS. 7 and 8.

FIG. 7 is a cross-sectional view of a wafer performed an imprinting process by an imprint apparatus according to Comparative Example. The left side of FIG. 7 illustrates the central portion of the shot, and the right side thereof illustrates the outer peripheral portion of the shot. In the imprint apparatus according to Comparative Example, only one time of ejection of droplets is performed for one shot. However, for example, in a case where the shot is a shot in which the central dent is relatively small and the dent in the outer peripheral portion is relatively large, in some cases, as illustrated in FIG. 7, the finish of the imprinting process between the central portion and the outer peripheral portion of the shot may be different. The outer peripheral portion having a large dent is thicker than the center in terms of the residual layer thickness Rr' of the resist, and is also insufficient in terms of the resist filling in the concave portion of the template. This is because the pressing force of the template against the wafer is weak. There is generally a trade-off relationship between the optimization of the residual layer thickness Rr' of the resist and the improvement of the resist filling, and thus, it is very difficult to simply improve such a finish difference by optimizing the drop recipe.

In addition, in the imprint apparatus according to Comparative Example, the same one recipe is applied to all the shots on the wafer. Therefore, in some cases, the finish difference as described above may occur for each shot.

In the imprint apparatus 100 according to the embodiment, two times of ejection of droplets are performed for each shot area S according to two different drop recipes A and B. The drop recipe A based on the pattern density is a drop recipe designed so as to sufficiently fill the resist, for example, even in a dense pattern. The drop recipe B based on the concave-convex arrangement in the shot area S plane is a drop recipe designed so that the residual layer thickness Rr of the resist becomes appropriate, for example, even in a portion with a large dent. Therefore, as illustrated in FIG. 8, the finish difference in the imprinting process in the shot area S is suppressed.

In addition, in the imprint apparatus 100 according to the embodiment, an appropriate drop recipe B is selected for each shot area S. Therefore, even in a case where each shot area S has a different concave-convex arrangement, the residual layer thickness Rr of the resist can be optimized for each shot area S. Therefore, the finish difference in the imprinting process between the shot areas S is suppressed.

In addition, in the imprint apparatus 100 according to the embodiment, at the time of ejecting the second droplets, the position of the mounting table 12 is corrected from the actual ejection positions of the first droplets. Therefore, it is possible to eject the droplets to more accurate positions.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprint apparatus, comprising:
    an ejection unit that ejects droplets of a resin-based mask material on a substrate on the basis of a droplet dropping condition; and
    a control unit that
        selects a first droplet dropping condition according to a pattern to be transferred to the resin-based mask material and a second droplet dropping condition according to an underlying step difference amount corresponding to a concave-convex arrangement of a first shot area of the substrate, and
        causes the ejection unit to eject the droplets with respect to the first shot area,
    wherein the first shot area is an area on the substrate where a pattern is formed by one time of imprinting.

2. The imprint apparatus according to claim 1, further comprising:
    a mounting table on which the substrate is mounted; and
    a detection unit that detects ejection positions that are positions after the ejection of the droplets on the substrate,
    wherein the control unit causes the ejection unit to eject the droplets in accordance with the first droplet dropping condition and, after that, causes the detection unit to detect the ejection positions of the droplets, and corrects a position of the mounting table according to the detected ejection positions and causes the ejection unit to eject the droplets in accordance with the second droplet dropping condition.

3. The imprint apparatus according to claim 1, wherein, under the first droplet dropping condition, a density of the droplets differs according to a density of the pattern in the first shot area.

4. The imprint apparatus according to claim 1, wherein, under the first droplet dropping condition, the droplets are densely arranged in an area where the pattern is dense in the first shot area and the droplets are sparsely arranged in an area where the pattern is sparse in the first shot area.

5. The imprint apparatus according to claim 1, wherein, under the second droplet dropping condition, a density of the droplets differs according to the underlying step difference amount of the first shot area.

6. The imprint apparatus according to claim 1, wherein, under the second droplet dropping condition, the droplets are densely arranged in an area where an underlying base is concave in the first shot area and the droplets are sparsely arranged in an area where the underlying base is convex in the first shot area.

7. The imprint apparatus according to claim 1, wherein the control unit selects a third droplet dropping condition according to an underlying step difference amount corresponding to a concave-convex arrangement of a second shot area of the substrate different from the first shot area of the substrate, and causes the ejection unit to eject the droplets in accordance with the third droplet dropping condition with respect to the second shot area.

8. The imprint apparatus according to claim 1, wherein the control unit causes the ejection unit to eject the droplets in accordance with the first droplet dropping condition with respect to a second shot area of the substrate different from the first shot area of the substrate, selects a third droplet dropping condition according to an underlying step difference amount corresponding to a concave-convex arrangement of the second shot area of the substrate, and causes the ejection unit to eject the droplets in accordance with the third droplet dropping condition with respect to the second shot area.

9. The imprint apparatus according to claim 1, wherein the control unit applies the first droplet dropping condition selected from a plurality of droplet dropping conditions optimized according to the pattern to be transferred to the resin-based mask material ejected on the substrate to all shot areas of the substrate, and applies the second droplet dropping condition selected from a plurality of droplet dropping conditions optimized according to an underlying step difference amount corresponding to a concave-convex arrangement for each of the shot areas of the substrate to a predetermined shot area of the substrate.

10. An imprint apparatus, comprising:
    an ejection unit that ejects droplets of a resin-based mask material on a substrate; and
    a control unit that
        applies two droplet dropping conditions of a droplet dropping condition optimized according to a pattern to be transferred to the resin-based mask material ejected on the substrate and a droplet dropping condition optimized according to an underlying step difference amount corresponding to a concave-convex arrangement for each of a plurality of shot areas of the substrate to one of the shot areas, and
        causes the ejection unit to eject the droplets,
    wherein the one of the shot areas is an area on the substrate where a pattern is formed by one time of imprinting, and
    the control unit applies the droplet dropping condition optimized according to the pattern to all of the shot areas of the substrate, and selects the droplet dropping condition optimized according to the underlying step difference amount for each of the shot areas of the substrate.

11. The imprint apparatus according to claim 10, further comprising:
    a mounting table on which the substrate is mounted; and
    a detection unit that detects ejection positions that are positions after the ejection of the droplets on the substrate,
    wherein the control unit causes the ejection unit to eject the droplets in accordance with a droplet dropping condition optimized according to the pattern with respect to a predetermined shot area of the substrate and, after that, causes the detection unit to detect the ejection positions of the droplets, and corrects the position of the mounting table according to the detected ejection positions and causes the ejection unit to eject the droplets in accordance with a droplet dropping condition optimized according to an underlying step difference amount with respect to the predetermined shot area of the substrate.

\* \* \* \* \*